(12) United States Patent
Frank et al.

(10) Patent No.: US 11,244,999 B2
(45) Date of Patent: Feb. 8, 2022

(54) ARTIFICIAL SYNAPSE WITH HAFNIUM OXIDE-BASED FERROELECTRIC LAYER IN CMOS BACK-END

(71) Applicant: International Business Machines Corporation, Armonk, NY (US)

(72) Inventors: Martin M. Frank, Dobbs Ferry, NY (US); Takashi Ando, Tuckahoe, NY (US); Xiao Sun, Pleasantville, NY (US); Jin Ping Han, Yorktown Heights, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/502,783

(22) Filed: Jul. 3, 2019

(65) Prior Publication Data
US 2019/0326387 A1     Oct. 24, 2019

Related U.S. Application Data

(62) Division of application No. 15/797,848, filed on Oct. 30, 2017, now Pat. No. 10,381,431.

(51) Int. Cl.
*H01L 49/02*     (2006.01)
*H01L 27/11507*  (2017.01)
*H01L 21/3213*   (2006.01)
*H01L 21/02*     (2006.01)
(Continued)

(52) U.S. Cl.
CPC .............. *H01L 28/40* (2013.01); *H01B 3/10* (2013.01); *H01L 21/02181* (2013.01); *H01L 21/02356* (2013.01); *H01L 21/283* (2013.01); *H01L 21/32133* (2013.01); *H01L 27/11507* (2013.01); *H01L 28/55* (2013.01); *H01L 28/60* (2013.01)

(58) Field of Classification Search
None
See application file for complete search history.

(56) References Cited

U.S. PATENT DOCUMENTS 6,875,667 B2   4/2005   Iizuka et al.
8,535,952 B2   9/2013   Ranjan et al.
8,698,313 B2   4/2014   Hirano et al.
(Continued)

OTHER PUBLICATIONS

H. Ishiwara, "Proposal of Adaptive-Learning Neuron Circuits with Ferroelectric Analog-Memory Weights," Jpn. J. Appl. Phys. 32, 442-446 (Jan. 1993).

(Continued)

*Primary Examiner* — Daniel Whalen
(74) *Attorney, Agent, or Firm* — Randall Bluestone; Michael J. Chang, LLC

(57) ABSTRACT

Artificial synaptic devices with an $HfO_2$-based ferroelectric layer that can be implemented in the CMOS back-end are provided. In one aspect, an artificial synapse element is provided. The artificial synapse element includes: a bottom electrode; a ferroelectric layer disposed on the bottom electrode, wherein the ferroelectric layer includes an $HfO_2$-based material that crystallizes in a ferroelectric phase at a temperature of less than or equal to about 400° C.; and a top electrode disposed on the bottom electrode. An artificial synaptic device including the present artificial synapse element and methods for formation thereof are also provided.

16 Claims, 9 Drawing Sheets

(51) Int. Cl.
*H01L 21/283* (2006.01)
*H01B 3/10* (2006.01)

(56) References Cited

U.S. PATENT DOCUMENTS

| | | | |
|---|---|---|---|
| 9,030,881 B2 | 5/2015 | Tokuhira et al. | |
| 9,362,487 B2 | 6/2016 | Inumiya et al. | |
| 9,576,801 B2 | 2/2017 | Li et al. | |
| 10,163,977 B1* | 12/2018 | Fantini | C01B 19/007 |
| 2007/0228427 A1 | 10/2007 | Matsui et al. | |
| 2009/0045485 A1 | 2/2009 | Hirota | |
| 2014/0355328 A1* | 12/2014 | Muller | G11C 11/2273 365/145 |
| 2016/0260889 A1 | 9/2016 | Annunziata et al. | |
| 2017/0062037 A1* | 3/2017 | Nicholes | H01L 28/75 |
| 2018/0190338 A1* | 7/2018 | Li | G11C 11/22 |

OTHER PUBLICATIONS

Kaneko et al., "Ferroelectric Artificial Synapses for Recognition of a Multishaded Image," IEEE Transactions on Electron Devices, vol. 61, Issue 8, pp. 2827-2833 (Aug. 2014).

Chernikova et al., "Ultrathin Hf0.5Zr0.5O2 Ferroelectric Films on Si," ACS Appl. Mater. Interfaces 2016, 8, pp. 7232-7237 (Mar. 2016).

Muller et al., "Ferroelectricity in yttrium-doped hafnium oxide," Journal of Applied Physics 110, 114113 (Dec. 2011) (5 total pages).

Hoffman et al., "Stabilizing the ferroelectric phase in doped hafnium oxide," Journal of Applied Physics 118, 072006 (Aug. 2015) (9 total pages).

T.S. Boscke et al., "Ferroelectricity in hafnium oxide: CMOS compatible ferroelectric field effect transistors," IEEE International Electron Devices Meeting (IEDM), Dec. 2011, 24.5 (4 total pages).

M.H. Park et al., "Ferroelectricity and Antiferroelectricity of Doped Thin HfO2-Based Films," Advanced Materials, vol. 27, No. 11, Feb. 2015, pp. 1811-1831.

A. Chanthbouala et al., "A ferroelectric memristor," Nature Materials, vol. 11, No. 10, Sep. 2012, pp. 860-864.

Z. Wen et al., "Ferroelectric-field-effect-enhanced electroresistance in metal/ferroelectric/semiconductor tunnel junctions," Nature Materials, vol. 12, No. 7, May 2013, pp. 617-621.

S. Fujii et al., "First demonstration and performance improvement of ferroelectric HfO2-based resistive switch with low operation current and intrinsic diode property," 2016 IEEE Symposium on VLSI Technology, Jun. 2016, 2 pages.

S. Oh et al., "HfZrOx-Based Ferroelectric Synapse Device With 32 Levels of Conductance States for Neuromorphic Applications," IEEE Electron Device Letters, vol. 38, No. 6, Jun. 2017, pp. 732-735.

List of IBM Patents or Applications Treated as Related (2 pages).

\* cited by examiner

A-A'

B-B'

ARTIFICIAL SYNAPSE WITH HAFNIUM OXIDE-BASED FERROELECTRIC LAYER IN CMOS BACK-END

CROSS-REFERENCE TO RELATED APPLICATIONS

This application is a divisional of U.S. application Ser. No. 15/797,848 filed on Oct. 30, 2017, now U.S. Pat. No. 10,381,431, the contents of which are incorporated by reference herein.

FIELD OF THE INVENTION

The present invention relates to artificial synaptic devices, and more particularly, to artificial synaptic devices with a hafnium oxide ($HfO_2$)-based ferroelectric layer that can be implemented in the complementary metal-oxide-semiconductor (CMOS) back-end.

BACKGROUND OF THE INVENTION

The realization of a synaptic element is of interest for hardware implementation of deep learning networks. Weights are modified and stored by modulating the conductivity of non-volatile memory array elements. Use of the adjustable channel conductance of ferroelectric (FE) field-effect transistors (FETs) FE-FETs as a synaptic weight date back to the early 1990s. See H. Ishiwara, "Proposal of Adaptive-Learning Neuron Circuits with Ferroelectric Analog-Memory Weights," Jpn. J. Appl. Phys. 32, 442-446 (January 1993).

Significant progress has been made using perovskite ferroelectrics such as $Pb(Zr,Ti)O_3$. See, for example, Kaneko et al., "Ferroelectric Artificial Synapses for Recognition of a Multishaded Image," IEEE Transactions on Electron Devices, vol. 61, Issue 8 (August 2014). However, implementation on a silicon complementary metal-oxide-semiconductor (CMOS) platform remains challenging due to incompatibilities of perovskite ferroelectrics with CMOS processing, e.g., due to the need for thick films and hydrogen barriers, thermal budgets that are incompatible with the CMOS back-end, and contamination risks posed by lead-containing perovskites.

Thus, techniques for implementing ferroelectric artificial synaptic devices in the CMOS back-end within the BEOL thermal budget limitations, and in a way that does not require thick films or hydrogen barriers, and which pose no undue contamination risks would be desirable.

SUMMARY OF THE INVENTION

The present invention provides artificial synaptic devices with a hafnium oxide ($HfO_2$)-based ferroelectric layer that can be implemented in the complementary metal-oxide-semiconductor (CMOS) back-end. In one aspect of the invention, an artificial synapse element is provided. The artificial synapse element includes: a bottom electrode; a ferroelectric layer disposed on the bottom electrode, wherein the ferroelectric layer includes a hafnium oxide ($HfO_2$)-based material that crystallizes in a ferroelectric (FE) phase at a temperature of less than or equal to about 400° C.; and a top electrode disposed on the bottom electrode.

In another aspect of the invention, a method of forming an artificial synaptic device is provided. The method includes: forming at least one complementary metal-oxide-semiconductor (CMOS) device on a substrate; depositing an interlayer dielectric (ILD) onto the substrate and covering the at least one CMOS device; depositing a first metal layer onto the ILD; patterning the first metal layer into a plurality of bottom metal lines; depositing a first electrode layer onto the bottom metal lines; depositing a ferroelectric film onto the first electrode layer, wherein the ferroelectric film includes a $HfO_2$-based material; annealing the ferroelectric film under conditions sufficient to crystallize the ferroelectric film in an FE phase; depositing a second electrode layer onto the ferroelectric film; patterning the first electrode layer, the ferroelectric film, and the second electrode layer into artificial synapse elements; depositing a second metal layer onto the artificial synapse elements; and patterning the second metal layer into a plurality of top metal lines that run orthogonal to the bottom metal lines.

In yet another aspect of the invention, an artificial synaptic device is provided. The artificial synaptic device includes: a plurality of top metal lines oriented orthogonal to a plurality of bottom metal lines; and artificial synapse elements present between the top metal lines and the bottom metal lines, wherein at least one of the artificial synapse elements includes: i) a bottom electrode, ii) a ferroelectric layer disposed on the bottom electrode, wherein the ferroelectric layer includes a $HfO_2$-based material that crystallizes in a FE phase at a temperature of less than or equal to about 400° C., and iii) a top electrode disposed on the bottom electrode.

A more complete understanding of the present invention, as well as further features and advantages of the present invention, will be obtained by reference to the following detailed description and drawings.

DETAILED DESCRIPTION OF PREFERRED EMBODIMENTS

Provided herein are ferroelectric artificial synapse devices that can be implemented in the complementary metal-oxide-semiconductor (CMOS) back-end, i.e., over a layer of CMOS driver circuitry. Namely, an artificial synapse is described herein that includes a metal-ferroelectric-metal (MFM) or metal-ferroelectric-semiconductor (MFS) stack in the CMOS back-end-of-line (BEOL) that incorporates a hafnium oxide ($HfO_2$)-based ferroelectric material that crystallizes at temperatures not exceeding the maximum allowed back-end-of-line temperature (TBEOL).

By way of example only, the TBEOL is less than or equal to about 450° C., and preferably less than or equal to about 400° C. Temperatures in excess of these values can damage or degrade the performance of the existing circuitry including the back-end CMOS driver circuitry.

Figure 1:
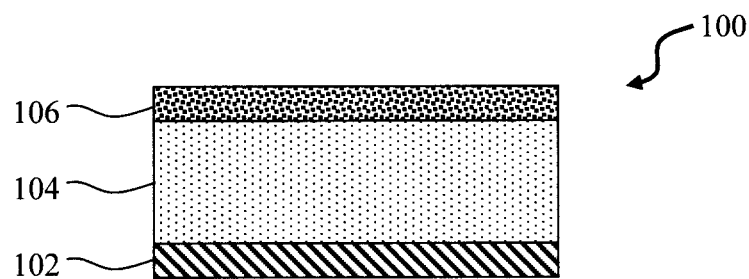
FIG. 1 is a diagram illustrating an exemplary artificial synapse element including a ferroelectric layer in between a bottom and a top electrode according to an embodiment of the present invention.

FIG. 1 is a diagram illustrating an exemplary artificial synapse element 100 in accordance with the present techniques. As shown in FIG. 1, artificial synapse element 100 includes a bottom electrode 102, a ferroelectric layer 104 disposed on the bottom electrode 102, and a top electrode 106 disposed on the ferroelectric layer 104.

A ferroelectric (FE) material is a material that exhibits electrically switchable spontaneous polarization. See, for example, Chernikova et al., "Ultrathin $Hf_{0.5}Zr_{0.5}O_2$ Ferroelectric Films on Si," ACS Appl. Mater. Interfaces 2016, 8, pgs. 7232-7237 (March 2016) (hereinafter "Chernikova"), the contents of which are incorporated by reference as if fully set forth herein. According to an exemplary embodiment, the ferroelectric layer 104 includes a $HfO_2$-based ferroelectric material such as hafnium-zirconium-oxide ($Hf_xZr_yO_2$), yttrium (Y)-doped $HfO_2$, and/or gadolinium (Gd)-doped $HfO_2$. Each of these ferroelectric materials can be deposited onto the bottom electrode 102 using a standard process such as atomic layer deposition (ALD) or sputtering. Once deposited, an anneal is needed to crystallize the ferroelectric material in the FE phase. Advantageously, with appropriate optimization of the deposition process, impurities, and the like, all of the above-described ferroelectric materials have the potential of crystallizing in the FE phase at a temperature less than or equal to about 400° C. Therefore, the present artificial synapse elements based on these ferroelectric materials are within the TBEOL (see above) and can be effectively implemented in the CMOS back-end.

Notably, in order to implement $HfO_2$-based ferroelectric materials in the CMOS back-end techniques are needed to lower the temperature at which $HfO_2$ crystallizes in the FE phase. For instance, thin $HfO_2$ films often crystallize at a temperature of from about 500° C. to about 600° C. which exceeds the TBEOL. However, with appropriate optimization of the deposition process, impurities, and the like, thin $HfO_2$ films have the potential of crystallizing at a temperature less than or equal to about 400° C. When introducing dopants such as aluminum (Al), silicon (Si), or lanthanum (La), the crystallization temperature is often increased. However, other dopants such as yttrium (Y) and/or gadolinium (Gd) can leave the crystallization temperature substantially unaffected. See, for example, Muller et al., "Ferroelectricity in yttrium-doped hafnium oxide," Journal of Applied Physics 110, 114113 (December 2011) and Hoffman et al., "Stabilizing the ferroelectric phase in doped hafnium oxide," Journal of Applied Physics 118, 072006 (August 2015), the contents of both of which are incorporated by reference as if fully set forth herein. Use of hafnium-zirconium-oxide can reduce the crystallization temperature to about 400° C. or less. See, for example, Chernikova. Accordingly, with appropriate optimization these modified $HfO_2$-based materials are all compatible with the CMOS TBEOL.

When the bottom electrode 102 and the top electrode 106 are both formed from a metal, artificial synapse element 100 has a MFM configuration with the ferroelectric layer 104 sandwiched between the two metal bottom and top electrodes 102 and 106. Suitable metals for the bottom and/or top electrodes include, but are not limited to, titanium nitride (TiN) and/or tantalum nitride (TaN).

When the artificial synapse element 100 has a MFM configuration it is desirable to introduce some level of asymmetry to the artificial synapse element 100 stack in order to increase the resistance ratio between up and down polarization. Asymmetry can be produced, for example, by varying the workfunction of the bottom electrode 102 vis-à-vis that of the top electrode 106. For instance, according to an exemplary embodiment, different workfunction metals are used to form the bottom and top electrodes 102 and 106. To use a simple example, bottom electrode 102 can be formed from TiN while top electrode 106 is formed from TaN, or vice versa. When the same metal (e.g., TiN or TaN) is used for both the bottom and top electrodes 102 and 106, the workfunction of the electrodes can be varied by varying the ratio of titanium (Ti) or tantalum (Ta) to nitrogen (N) (i.e., varying the Ti:N or Ta:N ratio) in the bottom versus the top electrodes 102 and 106.

Asymmetry can also be achieved by inserting a dielectric layer such as aluminum oxide ($Al_2O_3$) on one side of the artificial synapse element 100. See, for example, artificial synapse element 500 of FIG. 5—described below.

Alternatively, when one of the bottom electrode 102 or the top electrode 106 is formed from a semiconductor material (with the other electrode being formed from the above metal(s)), artificial synapse element 100 has a MFS configuration with the ferroelectric layer 104 sandwiched between one metal electrode (either the bottom or top electrode 102 and 106 is a metal) and a semiconductor electrode (the other bottom or top electrode 102 and 106 is a semiconductor material). Thus, to use an illustrative example, if the bottom electrode 102 is a metal, then the top electrode 106 would be a semiconductor material in the MFS design. Conversely, if the bottom electrode 102 is a semiconductor, then the top electrode 106 is a metal in the MFS design.

Suitable electrode metals were provided above. Suitable semiconductor electrode materials include, but are not limited to, doped silicon (Si), germanium (Ge), and/or silicon germanium (SiGe), in either crystalline, polycrystalline, or amorphous form.

It is noted that the artificial synapse element 100 shown in FIG. 1 generically depicts both an MFM and a MFS configuration. Further, the ferroelectric layer 104 forms a Schottky barrier with the metal electrode(s). Thus, with an MFM configuration a Schottky barrier is formed at the junction of the bottom electrode 102 and the ferroelectric layer 104, and also at the junction of the top electrode 106 and the ferroelectric layer 104. With the MFS configuration, a Schottky barrier is formed at the junction of the ferroelectric layer 104 and either the top electrode 102 or the bottom electrode 106 (whichever is metal).

The artificial synapse element 100 is representative of a two-terminal electrode (bottom electrode 102)-ferroelectric (ferroelectric layer 104)-electrode (top electrode 106) tunable resistor in accordance with an exemplary embodiment of the present techniques. Further, when the ferroelectric layer 104 is thin, direct tunneling can be achieved through the ferroelectric layer 104. By 'thin' it is meant that the ferroelectric layer 104 has a thickness, e.g., of from about 2 nanometers (nm) to about 4 nm, and ranges therebetween. In that case, artificial synapse element 100 is also referred to herein as ferroelectric tunnel junction (FTJ).

Figure 2:
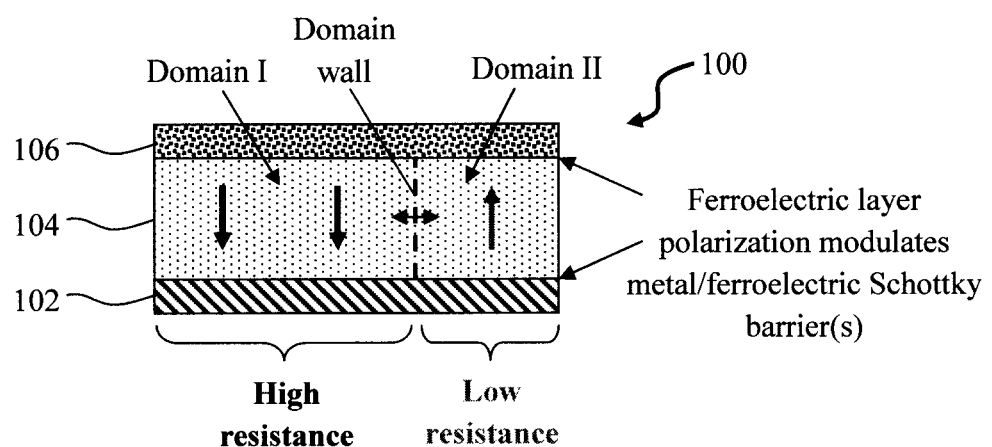
FIG. 2 is a diagram illustrating the operating principles of the present artificial synapse element when configured as a two-terminal ferroelectric tunnel junction according to an embodiment of the present invention.

FIG. 2 is a diagram illustrating the operating principles of the present artificial synapse element 100 when configured as a two-terminal FTJ. In general, the synaptic weight (or simply weight) stored in artificial synapse element 100 is modulated by varying the resistance of the ferroelectric layer 104. The resistance is determined by the area ratio of up- versus down-polarized ferroelectric layer 104. The polarization of the ferroelectric layer 104 modulates the metal electrode(s)/ferroelectric Schottky barrier(s) (see above), and thus the resistance across the artificial synapse element 100.

Thus, as shown in FIG. 2 a first domain (Domain I) of the ferroelectric layer 104 is up-polarized registering a high resistance, and a second domain (Domain II) of the ferroelectric layer 104 is down-polarized registering a low resistance, relative to one another. Data is stored in artificial synapse element 100 based on a ratio of the area of the ferroelectric layer 104 that is up-polarized (i.e., the area of Domain I) relative to the area of the ferroelectric layer 104 that is down-polarized (i.e., the area of Domain II).

Figure 3:
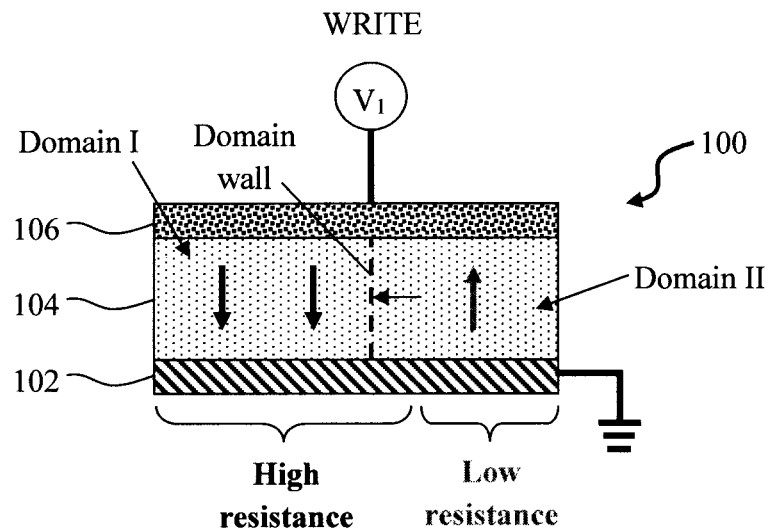
FIG. 3 is a diagram illustrating a vertical voltage pulse $V_1$ being applied to write data to the artificial synapse element by changing the area ratio of up-/down-polarized domains of the ferroelectric layer according to an embodiment of the present invention.

As shown in FIG. 3, to write data to artificial synapse element 100 this area ratio of up-/down-polarized domains is changed by applying a (+/−) voltage pulse ($V_1$) vertically through artificial synapse element 100. Specifically, a voltage pulse applied to the top electrode 106 (with the bottom electrode 102 connected to ground) will change the area of the first domain (Domain I) relative to the area of the second domain (Domain II) in ferroelectric layer 104. For illustrative purposes only, the applied voltage pulse has decreased the size of the first domain (Domain I) and increased the size of the second domain (Domain II). Compare FIG. 3 with FIG. 2. As shown in FIG. 3, this change in the area ratio of up-/down-polarized domains shifts the domain wall between the first/second domains.

Thus, in this particular example, the area of ferroelectric layer 104 having low resistance has been increased and the area of ferroelectric layer 104 having high resistance has been decreased. To look at it another way, the area ratio of up-/down-polarized domains has increased. This shift in the area ratio of up-/down-polarized domains will change the overall resistance throughout the artificial synapse element 100. It is notable that applying a voltage pulse of the opposite polarity would have the opposite effect (i.e., the ratio of up-/down-polarized domains would decrease).

Figure 4:
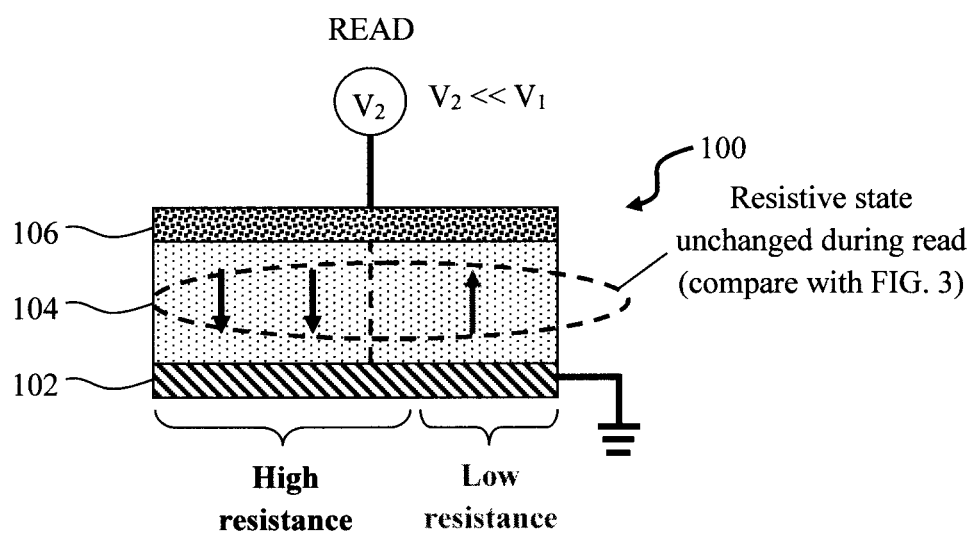
FIG. 4 is a diagram illustrating a smaller vertical voltage pulse $V_2$ being applied to read data from the artificial synapse element according to an embodiment of the present invention.

Once written, the resistance can be read from the artificial synapse element 100 by applying a much smaller voltage pulse $V_2$ (i.e., $V_2 \ll V_1$) than is needed to shift the area ratio of up-/down-polarized domains (e.g., $V_2$ is less than 0.5 volts (V)) and measuring the current, such that the resistance state of the artificial synapse element 100 is unchanged. See FIG. 4. Higher current measurements during the read would correspond to a lower overall resistance in artificial synapse element 100, and vice versa.

The write voltage pulse $V_1$ is applied to the device with a given pulse length (which denotes a length of time the voltage pulse is applied to the device, such as microsecond or nanosecond pulses). A magnitude of the write voltage pulse $V_1$ needed to write the artificial synapse element 100 can be predetermined. For instance, for a given configuration of the artificial synapse element 100, the applied voltage pulse $V_1$ can be increased (while resistance values are measured) until a change in the resistance of artificial synapse element 100 is detected.

Optionally, the present artificial synapse element stack can contain one or more additional layers between the electrodes (102/106) and the ferroelectric layer. See, for example, FIG. 5. As provided above, additional layers can be used to break the symmetry of the artificial synapse element stack thereby increasing the resistance ratio between up and down polarization.

Figure 5:
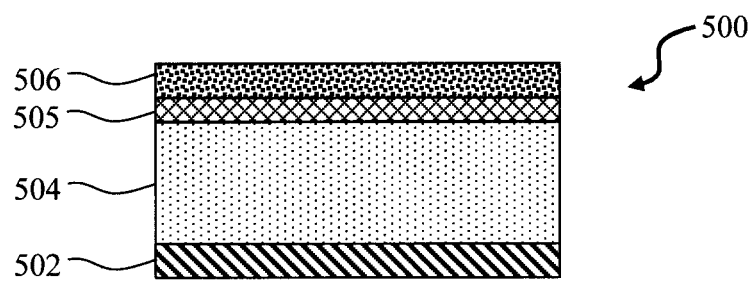
FIG. 5 is a diagram illustrating at least one additional layer (e.g., a dielectric layer and/or a semiconductor layer) disposed between the ferroelectric layer and the top electrode according to an embodiment of the present invention.

As above, artificial synapse element 500 of FIG. 5 includes a ferroelectric layer 504 sandwiched between a bottom electrode 502 and a top electrode 506. The bottom/top electrodes 502/506 can be configured in an MFM or MFS design. Suitable metal and semiconductor electrode materials were provided above. However, in this example at least one additional layer 505 is present between the ferroelectric layer 504 and the top electrode 506. Namely, while shown generically as a single layer, layer 505 can include multiple layers of one or more different materials. For instance, according to an exemplary embodiment, layer 505 includes a dielectric layer, a semiconductor layer, or combinations thereof. Suitable dielectrics include, but are not limited to silicon dioxide ($SiO_2$), aluminum oxide ($Al_2O_3$), lanthanum oxide ($La_2O_3$), paraelectric hafnium oxide (HfO$_2$), paraelectric zirconium oxide (ZrO$_2$), and/or silicon nitride (SiN). Suitable semiconductors include, but are not limited to, Si, Ge, and/or SiGe, in either crystalline, polycrystalline, or amorphous form.

Figure 6:
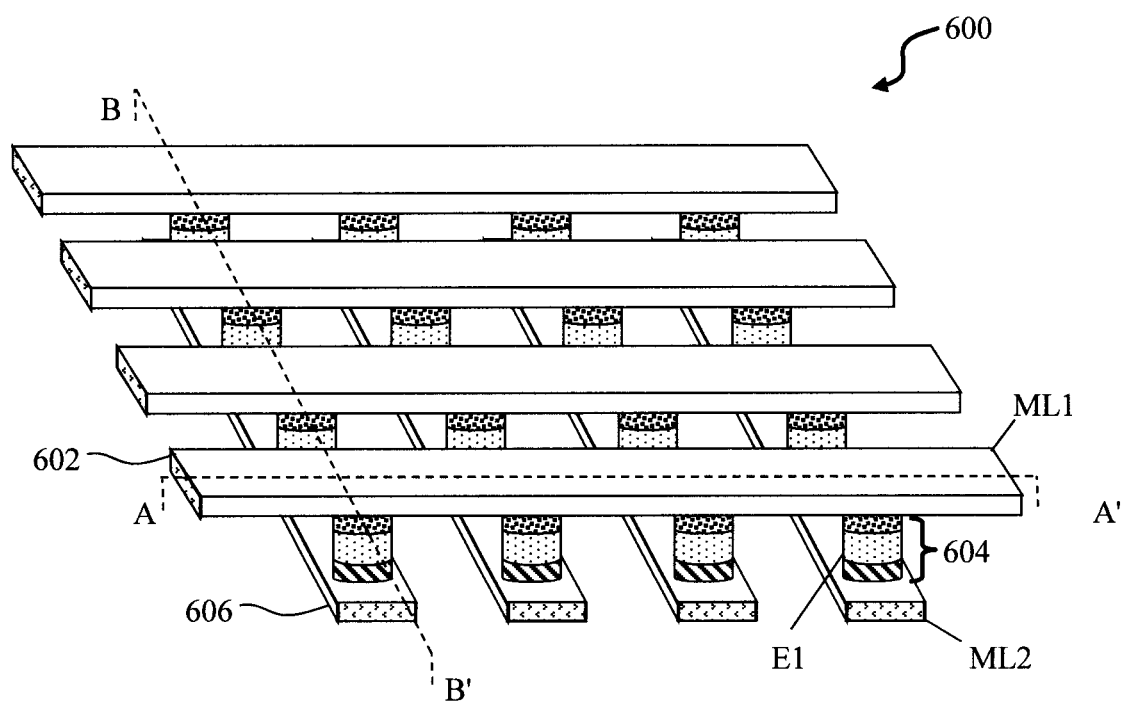
FIG. 6 is a diagram illustrating an artificial synaptic device configured as a cross-point array having the artificial synapse elements present between a plurality of top metal lines and a plurality of bottom metal lines according to an embodiment of the present invention.

Multiple artificial synapse elements can be used to form an artificial synaptic device. For instance, FIG. 6 is a diagram illustrating an artificial synaptic device 600 configured as a cross-point array of the present artificial synapse elements according to an exemplary embodiment. As shown in FIG. 6, device 600 includes a plurality of top metal lines 602 oriented orthogonal to a plurality of bottom metal lines 606. Preferably, the array includes N number of top metal lines 602 and M number of bottom metal lines 606.

Artificial synapse elements 604 are present between the top metal lines 602 and the bottom metal line 606. As shown in FIG. 6 an artificial synapse element 604 is present at each intersection of the top metal lines 602 and the bottom metal line 606. The artificial synapse elements 604 shown in FIG. 6 are representative of any the above-described artificial synapse elements. Thus, by way of example only, artificial synapse element 604 can be configured as artificial synapse element 100 of FIG. 1, as artificial synapse element 500 of FIG. 5, etc. As will become apparent from the description that follows, dielectrics may be employed to build the various levels of the device. For ease and clarity of depiction, however, these dielectric layers are not shown in FIG. 6.

The artificial synapse elements 604 in the array can be individually accessed by selecting a particular one (e.g., ML1) of the top metal lines 602 (which effectively selects all of the artificial synapse elements 604 along that particular metal line ML1). Next, a particular one (e.g., ML2) of the bottom metal lines 606 is selected which will access the particular artificial synapse element 604 (E1) at the intersection of the selected ML1 and ML2 metal lines. See FIG. 6.

Thus based on the read and write principles described above, data can be written to the artificial synapse elements 604 by applying a voltage pulse $V_1$ to a particular one (e.g., ML1) of the top metal lines 602, and connecting a particular one (e.g., ML2) of the bottom metal lines 606 to ground. This will write data to the artificial synapse element 604 at the intersection of ML1 and ML2. According to an exemplary embodiment, the write pulse is from about 1V to about 8V, and ranges therebetween, with a pulse length of from about 1 nanosecond (ns) to about 100 microseconds (µs), and ranges therebetween.

Similarly, data can be read from the artificial synapse elements 604 by applying a voltage pulse $V_2$ to a particular one (e.g., ML1) of the top metal lines 602, and measuring the resistance at a particular one (e.g., ML2) of the bottom metal lines 606. This will read data from the artificial synapse element 604 at the intersection of ML1 and ML2. As provided above, the read voltage pulse $V_2$ is much smaller than the write voltage pulse $V_1$, thus leaving the resistive state of the artificial synapse elements 604 undisturbed by the read operation. According to an exemplary embodiment, the read pulse is about 0.5V, with a pulse length of from about 1 ns to about 100 µs, and ranges therebetween.

An exemplary method for forming cross-point array artificial synaptic device 600 is now described by way of reference to FIGS. 7-19. FIGS. 7-19 provide views of different cross-sectional cuts (e.g., A-A' and B-B') through an array. See FIG. 6. Further, merely for ease and clarity of depiction, artificial synapse elements 100 (of FIG. 1) are used in the following description. However, it is to be understood that any of the artificial synapse element designs described herein (including artificial synapse elements 500) can be implemented in the same manner described.

Figure 7:
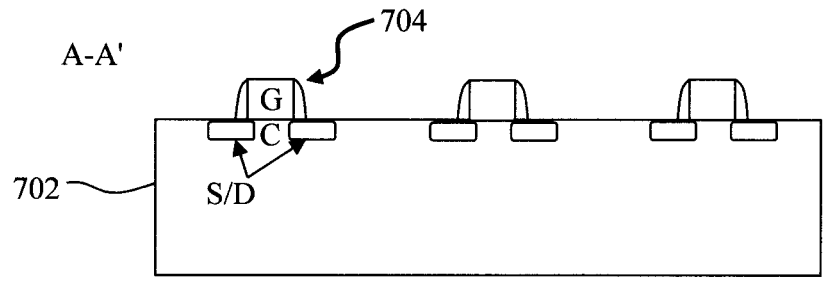
FIG. 7 is a diagram illustrating a starting structure for forming a cross-point array artificial synaptic device that includes one or more complementary metal-oxide-semiconductor (CMOS) devices having been formed on a substrate according to an embodiment of the present invention.
Figure 8:
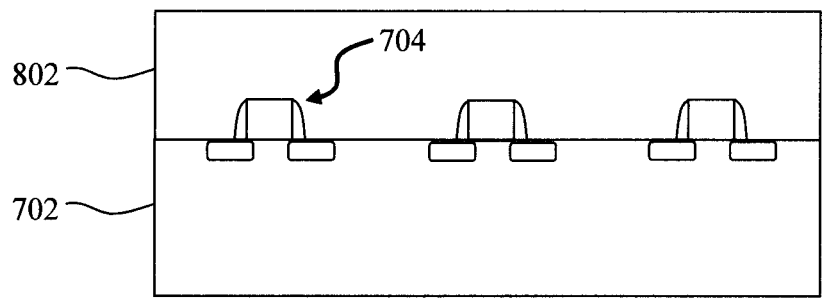
FIG. 8 is a diagram illustrating an interlayer dielectric (ILD) having been deposited onto the substrate, covering the CMOS devices according to an embodiment of the present invention.
Figure 9:
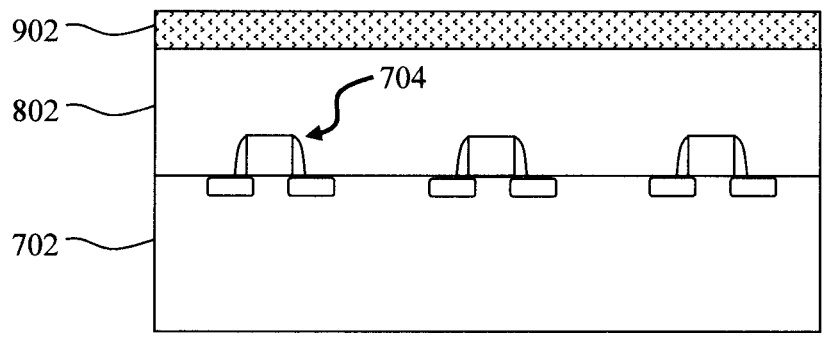
FIG. 9 is a diagram illustrating a metal layer having been deposited onto the ILD according to an embodiment of the present invention.

As provided above, the present artificial synapse elements can advantageously be integrated in the CMOS BEOL. Thus, for illustrative purposes only, the process begins as shown in FIG. 7 (cross-sectional view A-A') with one or more CMOS devices 704 having been formed on a substrate 702. By way of example only, the CMOS devices 704 are field effect transistors (FETs) each having a source and drain regions (S/D) interconnected by a channel region (C). A gate (G) regulates current flow through the channel region (C).

Suitable substrates 702 include, but are not limited to, a bulk semiconductor, e.g., Si, Ge, and/or SiGe wafer, and a semiconductor-on-insulator (SOI) wafer. A SOI wafer includes a SOI layer separated from a substrate by a buried insulator. When the insulator is an oxide, it is often referred to as a buried oxide or BOX.

It is notable that the CMOS devices 704 shown in FIG. 7 are examples merely provided to illustrate how the present artificial synaptic devices can be fabricated in the BEOL over CMOS circuitry. In accordance with the present techniques, any other type of CMOS circuitry can be incorporated in the present design. According to an exemplary embodiment, the CMOS devices 704 are the CMOS driver circuitry needed for the above-described read/write operations.

To enable the artificial synaptic device to be built on top of the CMOS circuitry, an interlayer dielectric (ILD) 802 is next deposited onto the substrate 702, covering the CMOS devices 704. See FIG. 8 (cross-sectional view A-A'). If necessary, following deposition the ILD 802 can be planarized (using a process such as chemical-mechanical polishing (CMP)).

A metal layer 902 is next deposited onto the ILD 802. See FIG. 9 (cross-sectional view A-A'). According to an exemplary embodiment, the metal layer 902 is formed from aluminum (Al), tungsten (W) and/or copper (Cu). Conventional processes such as evaporation or electrochemical plating can be used to deposit the metal layer 902.

Figure 10:
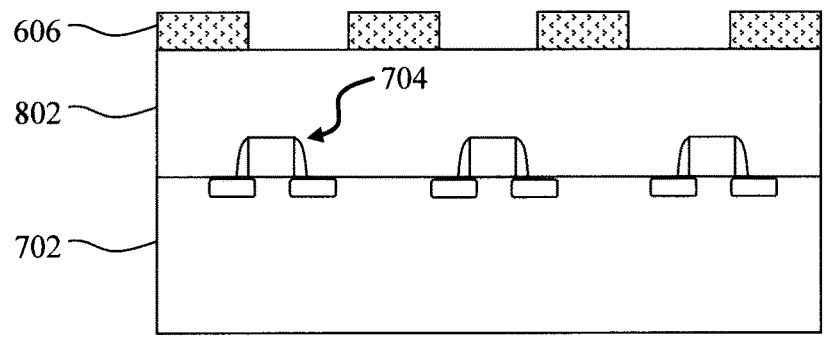
FIG. 10 is a diagram illustrating the metal layer having been patterned into the plurality of bottom metal lines according to an embodiment of the present invention.

The metal layer 902 will serve as the basis for forming the bottom metal lines 606 (see FIG. 6—described above). Namely, as shown in FIG. 10 (cross-sectional view A-A'), standard lithography and etching techniques are next used to pattern the metal layer 902 into the plurality of bottom metal lines 606 (see FIG. 6—described above).

Figure 11:
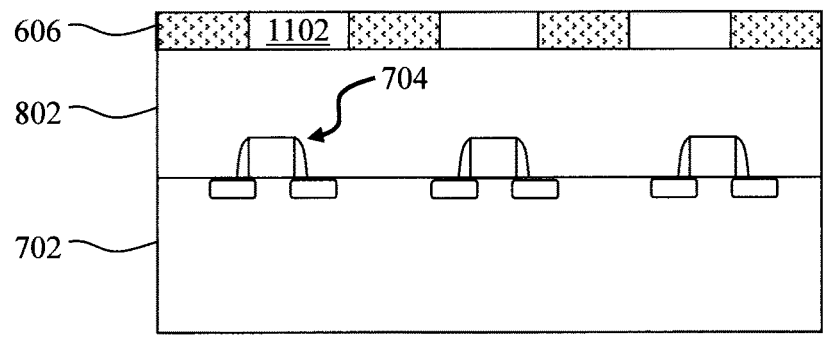
FIG. 11 is a diagram illustrating a dielectric having been deposited onto the ILD, filling the spaces between the bottom metal lines according to an embodiment of the present invention.

To enable the formation of the artificial synapse elements 604 on the bottom metal lines 606, a dielectric 1102 is next deposited onto the ILD 802, filling the spaces between the bottom metal lines 606. See FIG. 11 (cross-sectional view A-A'). For instance, the dielectric 1102 can first be blanket deposited onto the ILD 802, burying the bottom metal lines 606, and then polished (e.g., using CMP) down to the (top) surfaces of the bottom metal lines 606 (resulting in what is shown in FIG. 11). The top surfaces of the bottom metal lines 606 and the dielectric 1102 are now coplanar with one another. Suitable dielectrics 1102 include, but are not limited to, an oxide dielectric, such as SiO$_2$.

Figure 12:
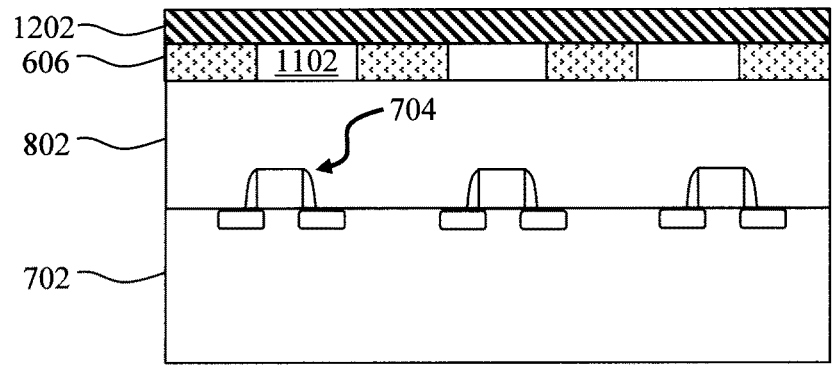
FIG. 12 is a diagram illustrating an electrode layer having been deposited onto the bottom metal lines and the dielectric according to an embodiment of the present invention.
Figure 13:
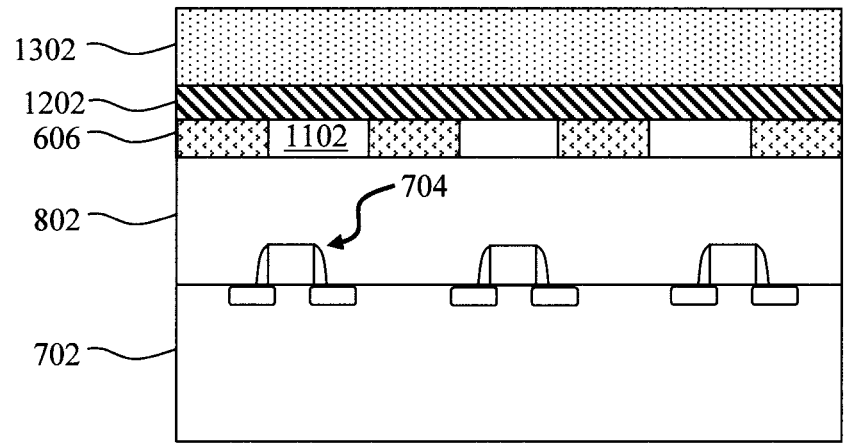
FIG. 13 is a diagram illustrating a ferroelectric film having been deposited onto the electrode layer according to an embodiment of the present invention.
Figure 14:
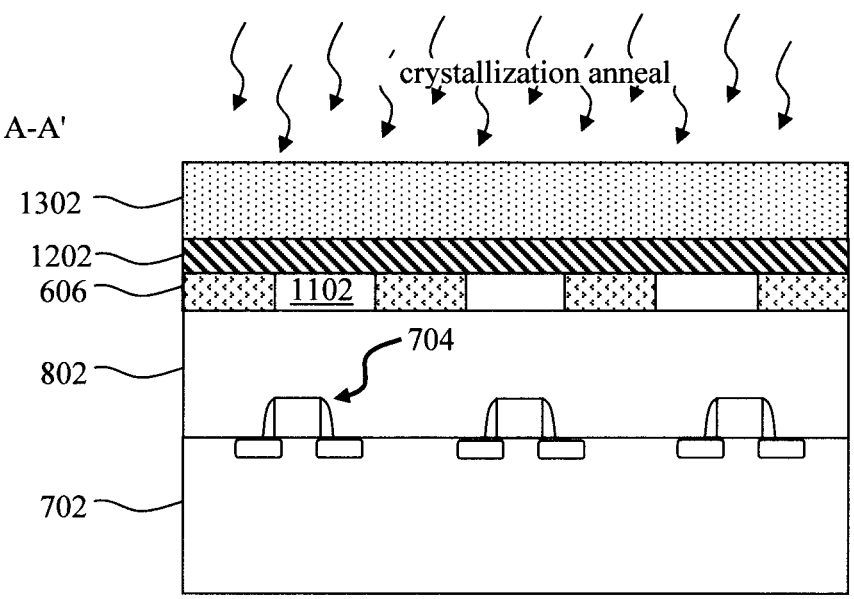
FIG. 14 is a diagram illustrating an anneal being performed to crystallize the ferroelectric film in the ferroelectric (FE) phase according to an embodiment of the present invention.

The artificial synapse elements 604 are then fabricated on top of the bottom metal lines 606. For instance, as shown in FIG. 12 (cross-sectional view A-A') an electrode layer 1202 is deposited onto the bottom metal lines 606 and the dielectric 1102. The electrode layer 1202 will serve as the basis for forming the bottom electrode 102 (see FIG. 1) of each of the artificial synapse elements 604. As provided above the bottom/top electrodes 102/106 can be configured in an MFM or MFS design. Thus, suitable materials for the electrode layer 1202 include, but are not limited to, metals such as TiN and/or TaN, and semiconductors such as Si, Ge and/or SiGe in either crystalline, polycrystalline, or amorphous form. Conventional processes such as evaporation or electrochemical plating can be used to deposit the electrode layer 1202.

A ferroelectric film 1302 is next deposited onto the electrode layer 1202. See FIG. 13 (cross-sectional view A-A'). The ferroelectric film 1302 will serve as the basis for forming the ferroelectric layer 104 (see FIG. 1) of each of the artificial synapse elements 604. As provided above, suitable ferroelectric materials include, but are not limited to, $HfO_2$-based ferroelectric materials such as $Hf_xZr_yO_2$, Y-doped $HfO_2$, and/or gadolinium Gd-doped $HfO_2$. Each of these ferroelectric materials can be deposited onto the electrode layer 1202 using a standard process such as ALD or sputtering.

As described above, an anneal is needed to crystallize the ferroelectric material in the FE phase. According to an exemplary embodiment, this anneal is performed immediately after the ferroelectric film 1302 is deposited onto the electrode layer 1202. See FIG. 14 (cross-sectional view A-A'). However, embodiments are anticipated herein where the anneal is performed later on in the process. For instance, the anneal can be performed during deposition of the top electrode, or after completion (and potentially even after patterning) of the element stack.

The anneal is performed under conditions sufficient to crystallize the ferroelectric film 1302 in the FE phase. According to an exemplary embodiment, the conditions include a temperature of from about 300° C. to about 400° C., and ranges therebetween, and a duration of from about 30 seconds to about 10 minutes, and ranges therebetween. As provided above, these annealing conditions are within the TBEOL and thus the present device designs are fully compatible with back-end processing constraints. For instance, in the present example, this annealing will not damage or degrade performance of the CMOS devices 704 already formed in the device.

Figure 15:
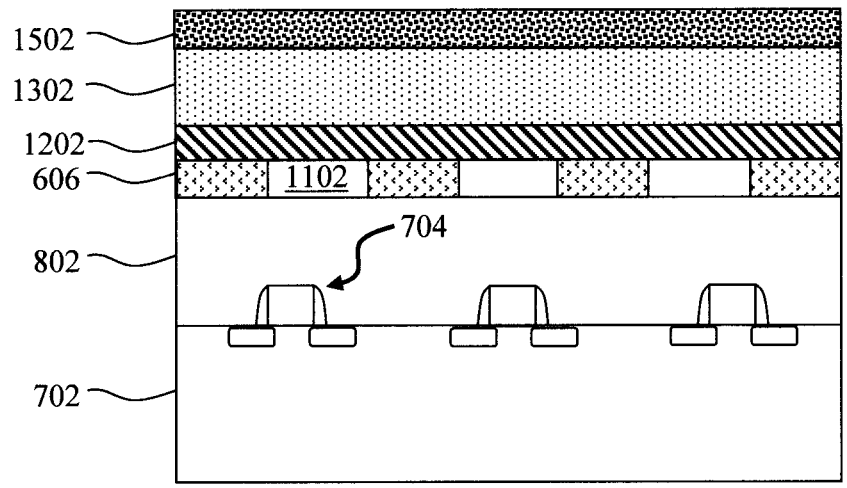
FIG. 15 is a diagram illustrating another electrode layer having been deposited onto the ferroelectric film according to an embodiment of the present invention.
Figure 16:
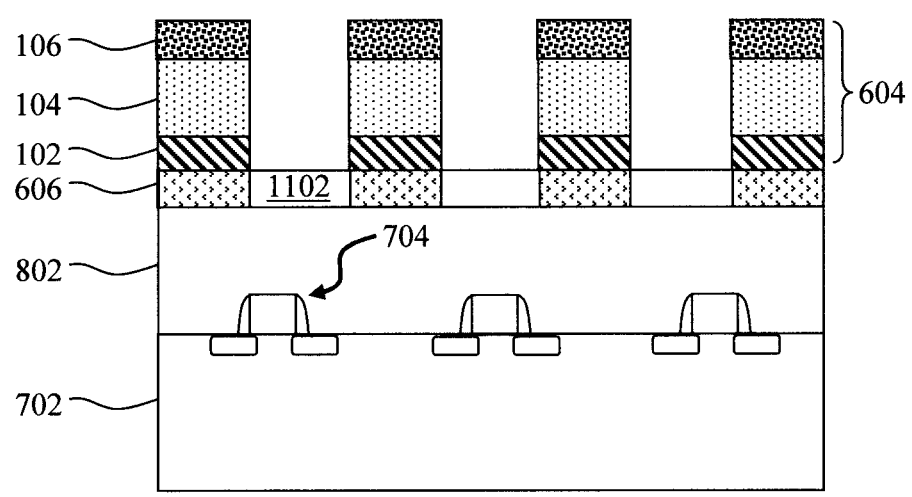
FIG. 16 is a diagram illustrating the element stack having been patterned into individual artificial synapse elements according to an embodiment of the present invention.

Next, as shown in FIG. 15 (cross-sectional view A-A') an electrode layer 1502 is deposited onto the ferroelectric film 1302. The electrode layer 1502 will serve as the basis for forming the top electrode 106 (see FIG. 1) of each of the artificial synapse elements 604. As provided above the bottom/top electrodes 102/106 can be configured in an MFM or MFS design. Thus, suitable materials for the electrode layer 1502 include, but are not limited to, metals such as TiN and/or TaN, and semiconductors such as Si, Ge and/or SiGe in either crystalline, polycrystalline, or amorphous form. Conventional processes such as evaporation or electrochemical plating can be used to deposit the electrode layer 1502.

As described, for example, in accordance with the description of FIG. 5 above, one or more additional layers of, e.g., dielectric and/or semiconductor, may optionally be disposed between the ferroelectric material and the top electrode. According to an exemplary embodiment, one or more of these additional layers (not shown) are deposited onto the ferroelectric film 1302 prior to the electrode layer 1502.

Once the element stack has been completed, standard lithography and etching techniques can be employed to pattern the element stack (e.g., electrode layer 1202/ferroelectric film 1302/electrode layer 1502) into individual artificial synapse elements 604. See FIG. 16 (cross-sectional view A-A'). As shown in FIG. 6, for example, the artificial synapse elements 604 can be patterned into pillar-shaped structures. Suitable techniques for patterning pillar-shaped tunnel junction elements from a device stack are described, for example, in U.S. Patent Application Publication Number 2016/0260889 A1 by Annunziata et al., entitled "Magnetic Tunnel Junction Patterning Using Low Atomic Weight Ion Sputtering," the contents of which are incorporated by reference as if fully set forth herein.

As provided above, the artificial synapse elements 604 are representative of any the above-described artificial synapse elements. Thus, by way of example only, the artificial synapse elements 604 can be configured as artificial synapse element 100 of FIG. 1, as artificial synapse element 500 of FIG. 5, etc. Using the artificial synapse element 100 of FIG. 1 as an example, the patterned electrode layer 1202/ferroelectric film 1302/electrode layer 1502 now form the bottom electrode 102/ferroelectric layer 104/top electrode 106, respectively. See FIG. 16.

Figure 17:
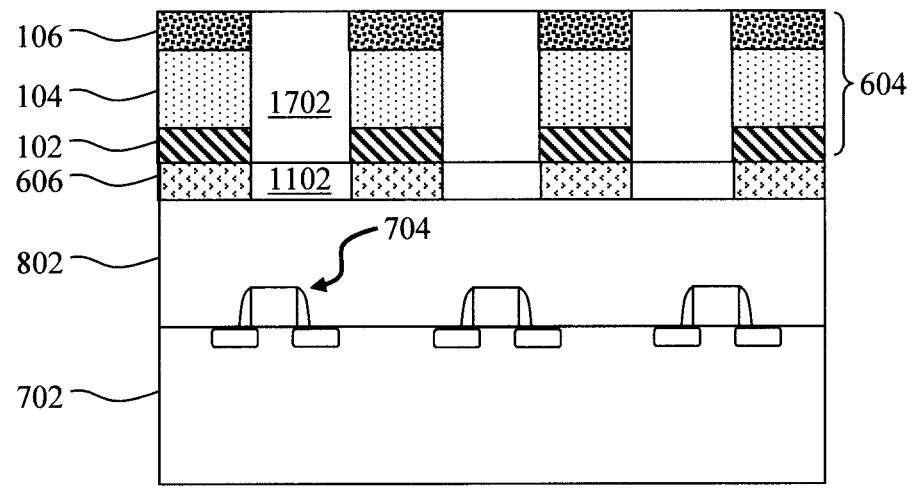
FIG. 17 is a diagram illustrating a dielectric having been deposited onto the artificial synapse elements, filling the spaces between the artificial synapse elements according to an embodiment of the present invention.

To enable the formation of top metal lines over the artificial synapse elements 604, a dielectric 1702 is next deposited onto the artificial synapse elements 604, filling the spaces between the artificial synapse elements 604. See FIG. 17 (cross-sectional view A-A'). For instance, the dielectric 1702 can first be blanket deposited onto the artificial synapse elements 604, burying the artificial synapse elements 604, and then polished (e.g., using CMP) down to the (top) surfaces of the top electrodes 106 (resulting in what is shown in FIG. 17). The top surfaces of the top electrodes 106 and the dielectric 1702 are now coplanar with one another. Suitable dielectrics 1702 include, but are not limited to, an oxide dielectric, such as $SiO_2$.

Figure 18:
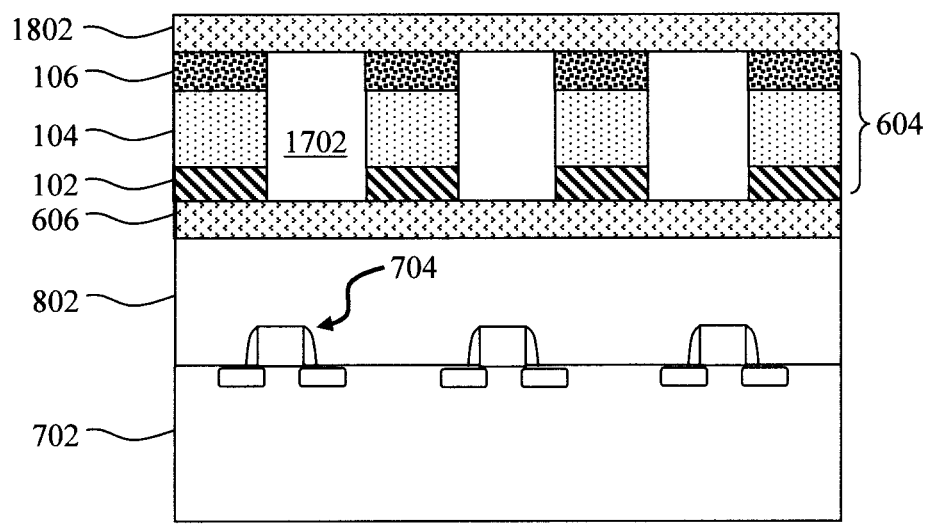
FIG. 18 is a diagram illustrating a metal layer having been deposited onto the artificial synapse elements/dielectric according to an embodiment of the present invention.

The top metal lines are to be formed running orthogonal to the bottom metal lines 606, thus the view in the figures now shifts to a cross-sectional view B-B' that is orthogonal (i.e., perpendicular) to the previously depicted cross-sectional views A-A'). For instance, as shown in FIG. 18 (cross-sectional view B-B') a metal layer 1802 is next deposited onto the artificial synapse elements 604/dielectric 1702. According to an exemplary embodiment, the metal layer 1802 is formed from Al, W and/or Cu. Conventional processes such as evaporation or electrochemical plating can be used to deposit the metal layer 1802.

Figure 19:
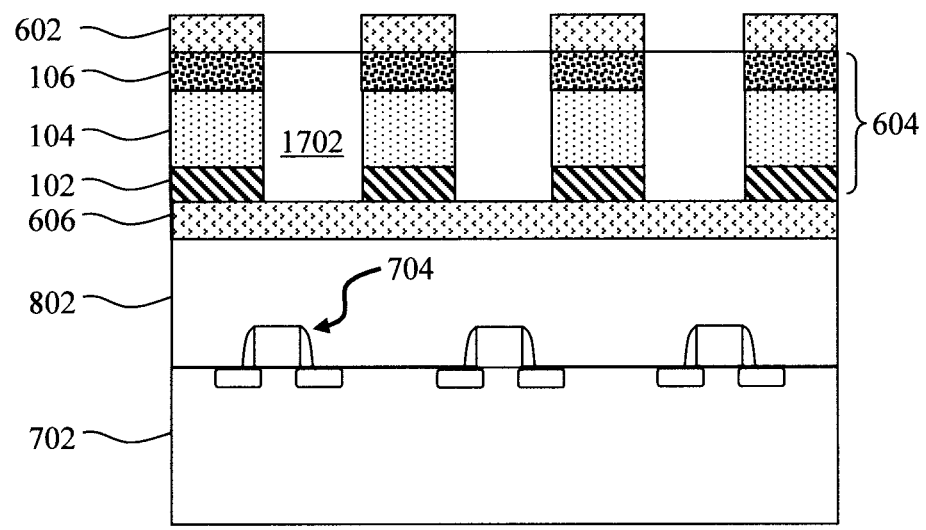
FIG. 19 is a diagram illustrating the metal layer having been patterned into the plurality of top metal lines according to an embodiment of the present invention.

The metal layer 1802 will serve as the basis for forming the top metal lines 602 (see FIG. 6—described above). Namely, as shown in FIG. 19 (cross-sectional view B-B'), standard lithography and etching techniques are next used to pattern the metal layer 1802 into the plurality of top metal lines 602 (see FIG. 6—described above).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An artificial synapse element, comprising:
a bottom electrode;
a ferroelectric layer disposed on the bottom electrode, wherein the ferroelectric layer comprises a hafnium oxide ($HfO_2$)-based material that is crystallized in a ferroelectric (FE) phase;
an additional layer disposed on only one side of the ferroelectric layer such that the artificial synapse element comprises an asymmetric stack of materials, wherein the additional layer is a semiconductor layer, and wherein the semiconductor layer comprises a semiconductor selected from the group consisting of: Si, Ge, SiGe, and combinations thereof; and a top electrode comprising a single continuous layer disposed directly on the additional layer, wherein the top electrode comprises a metal.

2. The artificial synapse element of claim 1, wherein the bottom electrode comprises the metal.

3. The artificial synapse element of claim 1, wherein both the bottom electrode and the top electrode comprise the metal, wherein the bottom electrode and the top electrode each comprises a same metal selected from the group consisting of: titanium nitride (TiN) and tantalum nitride (TaN), and wherein a Ti:N ratio or Ta:N ratio is different in the bottom electrode versus the top electrode.

4. The artificial synapse element of claim 1, wherein both the bottom electrode and the top electrode comprise the metal, and wherein the bottom electrode and the top electrode each comprises a different metal selected from the group consisting of: TiN and TaN.

5. The artificial synapse element of claim 1, wherein the bottom electrode comprises a semiconductor.

6. The artificial synapse element of claim 5, wherein the semiconductor is selected from the group consisting of: silicon (Si), germanium (Ge), silicon germanium (SiGe), and combinations thereof.

7. The artificial synapse element of claim 1, wherein the HfO2-based material is selected from the group consisting of: hafnium-zirconium-oxide ($Hf_xZr_yO_2$), yttrium (Y)-doped $HfO_2$, gadolinium (Gd)-doped $HfO_2$, and combinations thereof.

8. The artificial synapse element of claim 1, wherein the ferroelectric layer has a thickness of from about 2 nm to about 4 nm, and ranges therebetween, and wherein the artificial synapse element is a ferroelectric tunnel junction (FTJ).

9. An artificial synaptic device, comprising:
a plurality of top metal lines oriented orthogonal to a plurality of bottom metal lines; and
artificial synapse elements present between the top metal lines and the bottom metal lines, wherein at least one of the artificial synapse elements comprises: a bottom electrode, a ferroelectric layer disposed on the bottom electrode, wherein the ferroelectric layer comprises a $HfO_2$-based material that is crystallized in a ferroelectric (FE) phase, an additional layer disposed on only one side of the ferroelectric layer such that the artificial synapse element comprises an asymmetric stack of materials, wherein the additional layer is a semiconductor layer, and wherein the semiconductor layer comprises a semiconductor selected from the group consisting of: Si, Ge, SiGe, and combinations thereof, and a top electrode comprising a single continuous layer disposed directly on the additional layer, wherein the top electrode comprises a metal.

10. The artificial synaptic device of claim 9, wherein the bottom electrode comprises the metal.

11. The artificial synaptic device of claim 9, wherein both the bottom electrode and the top electrode comprise the metal, wherein the bottom electrode and the top electrode each comprises a same metal selected from the group consisting of: TiN and TaN, and wherein a Ti:N ratio or Ta:N ratio is different in the bottom electrode versus the top electrode.

12. The artificial synaptic device of claim 9, wherein both the bottom electrode and the top electrode comprise the metal, and wherein the bottom electrode and the top electrode each comprises a different metal selected from the group consisting of: TiN and TaN.

13. The artificial synaptic device of claim 9, wherein the bottom electrode comprises a semiconductor.

14. The artificial synaptic device of claim 13, wherein the semiconductor is selected from the group consisting of: Si, Ge, SiGe, and combinations thereof.

15. The artificial synaptic device of claim 9, wherein the $HfO_2$-based material is selected from the group consisting of: $Hf_xZr_yO_2$, Y-doped $HfO_2$, Gd-doped $HfO_2$, and combinations thereof.

16. The artificial synaptic device of claim 9, wherein the ferroelectric layer has a thickness of from about 2 nm to about 4 nm, and ranges therebetween, and wherein the artificial synapse element is a ferroelectric tunnel junction (FTJ).

* * * * *